(12) United States Patent
Yuan et al.

(10) Patent No.: US 12,016,219 B2
(45) Date of Patent: Jun. 18, 2024

(54) DISPLAY SUBSTRATE AND MANUFACTURING METHOD THEREOF, DISPLAY PANEL, AND DISPLAY DEVICE

(71) Applicants: HEFEI BOE JOINT TECHNOLOGY CO., LTD., Hefei (CN); BOE TECHNOLOGY GROUP CO., LTD., Beijing (CN)

(72) Inventors: Zhidong Yuan, Beijing (CN); Dacheng Zhang, Beijing (CN); Yongqian Li, Beijing (CN); Lang Liu, Beijing (CN); Zhongyuan Wu, Beijing (CN); Can Yuan, Beijing (CN); Meng Li, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 580 days.

(21) Appl. No.: 17/279,855

(22) PCT Filed: May 19, 2020

(86) PCT No.: PCT/CN2020/091048
§ 371 (c)(1),
(2) Date: Mar. 25, 2021

(87) PCT Pub. No.: WO2021/232238
PCT Pub. Date: Nov. 25, 2021

(65) Prior Publication Data
US 2022/0115486 A1 Apr. 14, 2022

(51) Int. Cl.
*H10K 59/131* (2023.01)
*H10K 50/842* (2023.01)
(Continued)

(52) U.S. Cl.
CPC ....... *H10K 59/131* (2023.02); *H10K 50/8426* (2023.02); *H10K 59/121* (2023.02);
(Continued)

(58) Field of Classification Search
CPC .... H10K 59/10; H10K 59/12; H10K 59/1201; H10K 59/121; H10K 59/1213;
(Continued)

(56) References Cited

U.S. PATENT DOCUMENTS

| 7,595,854 B2 | 9/2009 | Sung et al. |
| 7,901,961 B2 | 3/2011 | Sung et al. |

(Continued)

FOREIGN PATENT DOCUMENTS

| CN | 101140945 A | 3/2008 |
| CN | 106847867 A | 6/2017 |

(Continued)

OTHER PUBLICATIONS

Extended European Search Report dated Sep. 12, 2022, for corresponding European Application No. 20904258.9.
(Continued)

*Primary Examiner* — Natalia A Gondarenko
(74) *Attorney, Agent, or Firm* — Kinney & Lange, P.A.

(57) ABSTRACT

A display substrate includes: a base substrate including a display area and a peripheral area pixel units in the display area, each including a pixel drive circuit and a light emitting device the light emitting device including a first electrode, a second electrode, and a light emitting layer; a first power trace located in the peripheral area and electrically connected to the first electrode; a second power trace located in the peripheral area and electrically connected to the second electrode; a planarization layer with at least a portion thereof being located in the peripheral area. An orthographic projection of the planarization layer on the base substrate at
(Continued)

least partially overlaps an orthographic projection of each of the first and second power traces on the base substrate, the first and second power traces are located in different layers, and a portion of the planarization layer is located between the first and second power traces.

20 Claims, 9 Drawing Sheets

(51) Int. Cl.
*H10K 59/12* (2023.01)
*H10K 59/121* (2023.01)
*H10K 59/122* (2023.01)
*H10K 71/00* (2023.01)

(52) U.S. Cl.
CPC ........... *H10K 59/122* (2023.02); *H10K 71/00* (2023.02); *H10K 59/1201* (2023.02)

(58) Field of Classification Search
CPC .. H10K 59/122; H10K 59/124; H10K 59/131; H10K 59/30; H10K 59/353; H10K 59/805; H10K 59/80515; H10K 59/87; H10K 59/8722; H10K 59/873; H10K 50/805; H10K 50/813; H10K 50/84; H10K 50/8426; H10K 50/844; H10K 50/865; H10K 71/00; H10K 71/20; H10K 71/40; H10K 71/60; H01L 27/3276; H01L 27/3265
USPC ....... 257/40, 83, 31.083; 438/22, 24, 48, 51, 438/69, 463
See application file for complete search history.

(56) References Cited

U.S. PATENT DOCUMENTS

| | | |
|---|---|---|
| 9,773,854 B2 | 9/2017 | Jung |
| 9,905,630 B2 | 2/2018 | Lee et al. |
| 10,600,859 B2 | 3/2020 | Park et al. |
| 10,622,433 B2 | 4/2020 | Han |
| 10,978,447 B2 | 4/2021 | Kim et al. |
| 11,088,232 B2 | 8/2021 | Choi et al. |
| 2008/0054796 A1 | 3/2008 | Sung et al. |
| 2010/0062553 A1 | 3/2010 | Sung et al. |
| 2019/0189730 A1 | 6/2019 | Han |
| 2019/0206958 A1* | 7/2019 | Lee ..................... H10K 59/123 |
| 2021/0265450 A1* | 8/2021 | Oh ..................... H10K 50/8423 |

FOREIGN PATENT DOCUMENTS

| | | |
|---|---|---|
| CN | 107546243 A | 1/2018 |
| CN | 107945728 A | 4/2018 |
| CN | 110098223 A | 8/2019 |
| CN | 110265434 A | 9/2019 |
| CN | 110364550 A | 10/2019 |
| CN | 110880524 A | 3/2020 |
| EP | 1895592 A1 | 3/2008 |
| KR | 20190065757 A | 6/2019 |

OTHER PUBLICATIONS

First Chinese Office Action dated Apr. 7, 2023, for corresponding Chinese Application No. 202080000767.8.

* cited by examiner

DISPLAY SUBSTRATE AND MANUFACTURING METHOD THEREOF, DISPLAY PANEL, AND DISPLAY DEVICE

CROSS-REFERENCE TO RELATED APPLICATION

This application is a Section 371 National Stage Application of International Application No. PCT/CN2020/091048, filed on May 19, 2020, entitled "DISPLAY SUBSTRATE AND MANUFACTURING METHOD THEREOF, DISPLAY PANEL, AND A DISPLAY DEVICE", which is incorporated herein by reference in its entirety.

TECHNICAL FIELD

The present disclosure relates to the field of display technology, and in particular to a display substrate and a manufacturing method thereof, a display panel, and a display device.

BACKGROUND

Organic light-emitting diode (OLED) display device is a self-luminous device and does not require a backlight. Compared with traditional liquid crystal display (LCD) devices, the OLED display device also provides more vivid colors and a larger color gamut. In addition, the OLED display devices may be made more flexible, thinner and lighter than typical LCD devices. The OLED display device generally includes an anode, an organic layer including an organic light-emitting layer, and a cathode. The OLED may be a bottom emission OLED or a top emission OLED. In the bottom emission OLED, light is extracted from an anode side. In the bottom emission OLED, the anode is usually transparent, and the cathode is usually reflective. In the top emission OLED, light is extracted from a cathode side. In the top emission OLED, the cathode is optically transparent, and the anode is reflective. The top emission OLED is more suitable for a high PPI display product, which adapts to market development trends and conforms to industry development trends. Therefore, designs of the top emission OLED display device have gradually become one of focuses of researchers.

The above information disclosed in this section is only for the understanding of the background of the inventive concept of the present disclosure. Therefore, the above information may include information that does not constitute the prior art.

SUMMARY

In one aspect, a display substrate is provided, including: a base substrate including a display area and a peripheral area located on at least a first side of the display area; a plurality of pixel units arranged in an array in a first direction and a second direction in the display area of the base substrate, wherein each of the pixel units includes a pixel drive circuit and a light-emitting device electrically connected to the pixel drive circuit, the light-emitting device includes a first electrode, a second electrode, and a light-emitting layer arranged between the first electrode and the second electrode; a first power trace located in the peripheral area and electrically connected to the first electrode; a second power trace located in the peripheral area and electrically connected to the second electrode; a planarization layer with at least a portion thereof being located in the peripheral area; and a frame sealant, wherein the peripheral area includes a first peripheral area located on a side of the frame sealant close to the display area and a second peripheral area located on a side of the frame sealant away from the display area, the first side of the display area is a signal input side, and the first power trace and the second power trace are both located in the first peripheral area and on the signal input side, and wherein an orthographic projection of the planarization layer on the base substrate at least partially overlaps an orthographic projection of each of the first power trace and the second power trace on the base substrate, the first power trace and the second power trace are located in different layers, and a portion of the planarization layer is located between the first power trace and the second power trace.

According to some exemplary embodiments, the planarization layer includes a first portion located in the first peripheral area and a second portion located in the second peripheral area, an orthographic projection of the first portion of the planarization layer on the base substrate at least partially overlaps the orthographic projection of each of the first power trace and the second power trace on the base substrate, and the first portion of the planarization layer is located between the first power trace and the second power trace.

According to some exemplary embodiments, the first portion of the planarization layer has a first side surface away from the display area, the first power trace has a first side surface away from the display area, the second power trace has a first side surface away from the display area, the first side surface of the first power trace is farther away from the display area than the first side surface of the second power trace, and the first side surface of the first portion of the planarization layer is farther away from the display area than the first side surface of the first power trace.

According to some exemplary embodiments, the first portion of the planarization layer is located on a side of the second power trace away from the base substrate and is in contact with a surface of the second power trace away from the base substrate.

According to some exemplary embodiments, the first portion of the planarization layer is located on a side of the first power trace close to the base substrate and is in contact with a surface of the first power trace close to the base substrate.

According to some exemplary embodiments, the display substrate further includes a plurality of pads arranged on the signal input side and located in the peripheral area, wherein the second portion of the planarization layer is adjacent to the plurality of pads.

According to some exemplary embodiments, the display substrate further includes a first signal trace electrically connecting at least one of the plurality of pads and at least one of the plurality of pixel units, the first signal trace includes a first portion located in the first peripheral area and a second portion located in the second peripheral area, the first portion of the first signal trace is located in a different layer from the first power trace, the first portion of the planarization layer is located between the first power trace and the first portion of the first signal trace, and the orthographic projection of the first portion of the planarization layer on the base substrate at least partially overlaps an orthographic projection of the first portion of the first signal trace on the base substrate.

According to some exemplary embodiments, an orthographic projection of the second portion of the planarization layer on the base substrate at least partially overlaps an orthographic projection of the second portion of the first signal trace on the base substrate.

According to some exemplary embodiments, each of the first portion of the planarization layer and the second portion of the planarization layer is spaced apart from the frame sealant.

According to some exemplary embodiments, each of the first portion of the planarization layer and the second portion of the planarization layer is spaced apart from the frame sealant by a distance above 50 microns.

According to some exemplary embodiments, the display substrate further includes a second signal trace electrically connecting at least one of the plurality of pads and at least one of the plurality of pixel units, and the orthographic projection of the first power trace on the base substrate does not overlap an orthographic projection of the second signal trace on the base substrate.

According to some exemplary embodiments, the first power trace includes a first portion and a second portion, an orthographic projection of the first portion of the first power trace on the base substrate at least partially overlaps the orthographic projection of the second power trace on the base substrate, and an orthographic projection of the second portion of the first power trace on the base substrate does not overlap the orthographic projection of the second power trace on the base substrate.

According to some exemplary embodiments, the first portion of the first power trace has a first size in the first direction, the second portion of the first power trace has a second size in the first direction, and the first size is greater than the second size.

According to some exemplary embodiments, the display substrate further includes: at least one thin film transistor arranged on the base substrate, wherein the thin film transistor includes an active layer, a gate electrode, a source electrode and a drain electrode; a first conductive layer arranged on a side of the active layer away from the base substrate, wherein the gate electrode is located in the first conductive layer; a second conductive layer arranged on a side of the first conductive layer away from the base substrate, wherein the source electrode and the drain electrode are located in the second conductive layer; a third conductive layer arranged on a side of the second conductive layer away from the base substrate, wherein the second electrode is located in the third conductive layer; and a fourth conductive layer arranged on a side of the third conductive layer away from the base substrate, wherein the first electrode is located in the fourth conductive layer.

According to some exemplary embodiments, the display substrate further includes a passivation layer arranged between the second conductive layer and the third conductive layer, and the planarization layer is arranged between the passivation layer and the third conductive layer.

According to some exemplary embodiments, the first power trace is located in the third conductive layer; and/or the second power trace is located in the second conductive layer.

According to some exemplary embodiments, the display substrate further includes an auxiliary electrode trace located in the second conductive layer, wherein the auxiliary electrode trace electrically connects the first power trace and the first electrode.

According to some exemplary embodiments, the display substrate further includes a first power lead located in the first conductive layer or the second conductive layer and a conductive connection portion located in the third conductive layer; the first power lead has one end connected to one of the plurality of pads and the other end connected to the first power trace through a first opening; and the first power trace is connected to the auxiliary electrode trace through a second opening, the auxiliary electrode trace is connected to the conductive connection portion through a third opening, and the conductive connection portion is connected to the first electrode through a fourth opening.

According to some exemplary embodiments, the first power trace includes a first trace portion, a second trace portion and a third trace portion, an orthographic projection of the second trace portion of the first power trace on the base substrate covers an orthographic projection of the first opening on the base substrate, an orthographic projection of the third trace portion of the first power trace on the base substrate covers an orthographic projection of the second opening on the base substrate, the first trace portion of the first power trace is a portion of the first power trace other than the second trace portion and the third trace portion, and the orthographic projection of the planarization layer on the base substrate covers an orthographic projection of the first trace portion of the first power trace on the base substrate.

According to some exemplary embodiments, the display substrate further includes a pixel defining layer arranged on a side of the second electrode away from the base substrate, an orthographic projection of the pixel defining layer on the base substrate covers the orthographic projection of the first portion of the planarization layer on the base substrate.

According to some exemplary embodiments, the pixel defining layer includes a first side surface away from the display area, and an orthographic projection of the first side surface of the pixel defining layer on the base substrate is farther away from the display area than an orthographic projection of the first side surface of the first portion of the planarization layer on the base substrate.

According to some exemplary embodiments, the first electrode is a cathode of an organic light-emitting device, and the second electrode is an anode of the organic light-emitting device.

According to some exemplary embodiments, the cathode contains a transparent conductive material, and the anode contains a metal material.

According to some exemplary embodiments, the first signal trace includes a data trace for transmitting a data signal, and the second signal trace includes a scanning trace for transmitting a scanning signal.

In another aspect, a display panel is provided, including the above-mentioned display substrate.

In another aspect, a display device is provided, including the above-mentioned display substrate or the above-mentioned display panel.

In yet another aspect, a manufacturing method of a display substrate is provided, including:
  providing a base substrate including a display area and a peripheral area located on at least a first side of the display area;
  forming a plurality of pixel units in the display area of the base substrate, wherein the plurality of pixel units are arranged in an array in a first direction and a second direction in the display area of the base substrate, and each of the plurality of pixel units includes a pixel drive circuit;
  forming a planarization layer on a side of the pixel units away from the base substrate, wherein at least a portion of the planarization layer is located in the peripheral area;

forming a plurality of light-emitting devices on the base substrate, wherein the plurality of light-emitting devices are respectively electrically connected to the pixel drive circuits of the plurality of pixel units, each of the light-emitting devices includes a first electrode, a second electrode, and a light-emitting layer arranged between the first electrode and the second electrode;

forming a first power trace and a second power trace in the peripheral area of the base substrate; and forming a frame sealant in the peripheral area of the base substrate, wherein the peripheral area includes a first peripheral area on a side of the frame sealant close to the display area and a second peripheral area on a side of the frame sealant away from the display area, the first side of the display area is a signal input side, and the first power trace and the second power trace are both located in the first peripheral area and on the signal input side;

wherein the first power trace is electrically connected to the first electrode, and the second power trace is electrically connected to the second electrode; and wherein an orthographic projection of the planarization layer on the base substrate at least partially overlaps an orthographic projection of each of the first power trace and the second power trace on the base substrate, the first power trace and the second power trace are located in different layers, and a portion of the planarization layer is located between the first power trace and the second power trace.

BRIEF DESCRIPTION OF THE DRAWINGS

By describing in detail exemplary embodiments of the present disclosure with reference to accompanying drawings, features and advantages of the present disclosure will become more apparent.

DETAILED DESCRIPTION OF EMBODIMENTS

Figure 1:
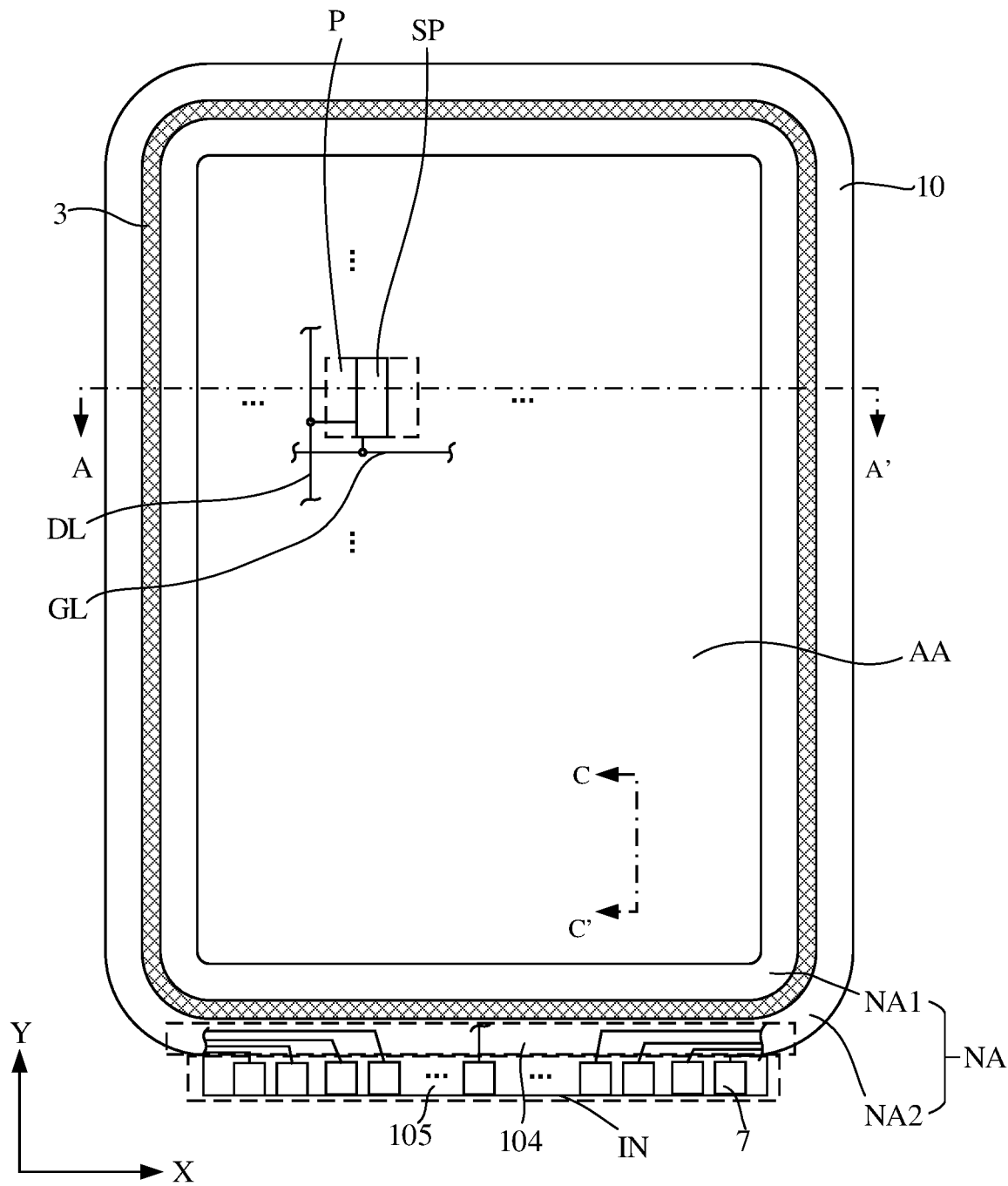
FIG. 1 shows a plan view of an OLED display panel according to some exemplary embodiments of the present disclosure.

In order to make objectives, technical solutions and advantages of the present disclosure more clear, the technical solutions of the embodiments of the present disclosure are clearly and completely described below with reference to the drawings. Obviously, the described embodiments are only a part but not all of the embodiments of the present disclosure. Based on the embodiments of the present disclosure, all other embodiments obtained by those skilled in the art without carrying out creative work fall within the protection scope of the present disclosure.

It should be noted that, in the drawings, for clarity and/or description purposes, size and relative size of elements may be enlarged. Accordingly, the size and relative size of each element need not to be limited to those shown in the drawings. In the specification and drawings, the same or similar reference numerals indicate the same or similar components.

When an element is described as being "on", "connected to" or "coupled to" another element, the element may be directly on the other element, directly connected to the other element, or directly coupled to the other element, or an intermediate element may be present. However, when an element is described as being "directly on", "directly connected to" or "directly coupled to" another element, no intermediate element is present. Other terms and/or expressions used to describe the relationship between elements, for example, "between" and "directly between", "adjacent" and "directly adjacent", "above" and "directly above", and so on, should be interpreted in a similar manner. In addition, the term "connected" may refer to a physical connection, an electrical connection, a communication connection, and/or a fluid connection. In addition, X axis, Y axis and Z axis are not limited to three axes of a rectangular coordinate system, and may be interpreted in a broader meaning. For example, the X axis, Y axis and Z axis may be perpendicular to each other, or may represent different directions that are not perpendicular to each other. For the objective of the present disclosure, "at least one of X, Y and Z" and "at least one selected from a group consisting of X, Y and Z" may be interpreted as only X, only Y, only Z, or any combination of two or more of X, Y and Z, such as XYZ, XYY, YZ and ZZ. As used herein, the term "and/or" includes any and all combinations of one or more of listed related items.

It should be noted that although the terms "first", "second", and so on may be used herein to describe various components, members, elements, regions, layers and/or parts, these components, members, elements, regions, layers and/or parts should not be limited by these terms. Rather, these terms are used to distinguish one component, member, element, region, layer and/or portion from another one. Thus, for example, a first component, a first member, a first element, a first region, a first layer and/or a first portion discussed below may be referred to as a second component, a second member, a second element, a second region, a second layer and/or a second portion without departing from the teachings of the present disclosure.

For ease of description, spatial relationship terms, such as "upper", "lower", "left", "right", may be used herein to describe the relationship between one element or feature and another element or feature as shown in the drawings. It should be understood that the spatial relationship terms are intended to cover other different orientations of the device in use or operation in addition to the orientation described in the figure. For example, if the device in the drawings is turned upside down, an element or feature described as "below" or "under" another element or feature will be oriented "above" or "on" the other element or feature.

Those skilled in the art should understand that in the present disclosure, unless otherwise specified, the expression "height" or "thickness" refers to a size in a direction perpendicular to a surface of each film layer arranged in the display panel, that is, a size in a light-emitting direction of the display panel, or called a size in a normal direction of the display device, or called a size in the Z direction in the drawings.

In the present disclosure, unless otherwise specified, the expression "patterning process" generally includes steps of photoresist coating, exposure, development, etching, and photoresist stripping. The expression "one-time patterning process" means a process of forming patterned layers, components elements and so on using one mask.

It should be noted that the expressions "same layer", "disposed in the same layer" or similar expressions refer to a layer structure formed by first using the same film forming process to form a film layer for forming a specific pattern, and then using the same mask to pattern the film layer by using one-time patterning process. Depending on the specific patterns, the one-time patterning process may include multiple exposure, development or etching processes, and the specific patterns in the layer structure formed may be continuous or discontinuous. These specific patterns may also be at different heights or have different thicknesses.

In the present disclosure, unless otherwise specified, the expression "electrically connected" may mean that two components or elements are directly electrically connected. For example, component or element A is in direct contact with component or element B, and electrical signals may be transmitted between the two components or elements. It may also mean that two components or elements are electrically connected through a conductive medium such as a conductive wire. For example, component or element A is electrically connected to component or element B through a conductive wire so as to transmit electrical signals between the two components or elements. Alternatively, it may also mean that two components or elements are electrically connected through at least one electronic component. For example, component or element A is electrically connected to component or element B through at least one thin film transistor so as to transmit electrical signals between the two components or elements.

Embodiments of the present disclosure at least provide a display substrate, including: a base substrate including a display area and a peripheral area located on at least a first side of the display area; a plurality of pixel units arranged in an array in a first direction and a second direction in the display area of the base substrate, wherein each of the pixel units includes a pixel drive circuit and a light-emitting device electrically connected to the pixel drive circuit, the light-emitting device includes a first electrode, a second electrode, and a light-emitting layer arranged between the first electrode and the second electrode; a first power trace located in the peripheral area and electrically connected to the first electrode; a second power trace located in the peripheral area and electrically connected to the second electrode; a planarization layer with at least a portion thereof being located in the peripheral area; and a frame sealant, wherein the peripheral area includes a first peripheral area located on a side of the frame sealant close to the display area and a second peripheral area located on a side of the frame sealant away from the display area, the first side of the display area is a signal input side, and the first power trace and the second power trace are both located in the first peripheral area and on the signal input side, and wherein an orthographic projection of the planarization layer on the base substrate at least partially overlaps an orthographic projection of each of the first power trace and the second power trace on the base substrate, the first power trace and the second power trace are located in different layers, and a portion of the planarization layer is located between the first power trace and the second power trace. In this way, undesirable phenomena such as a short circuit between the first power trace and the second power trace may be avoided.

Figure 2:
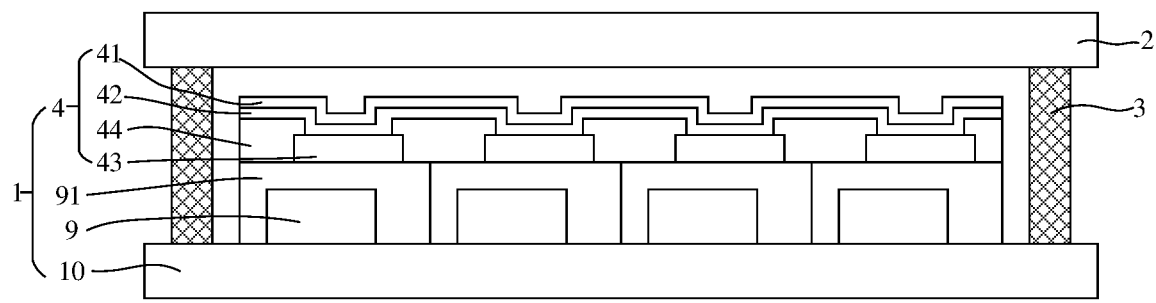
FIG. 2 shows a cross-sectional view of the OLED display panel according to some exemplary embodiments of the present disclosure, taken along line AA' in FIG. 1.

FIG. 1 shows a plan view of an OLED display panel according to some exemplary embodiments of the present disclosure. FIG. 2 shows a cross-sectional view of the OLED display panel according to some exemplary embodiments of the present disclosure, taken along line AA' in FIG. 1. Referring to FIG. 1 and FIG. 2 in combination, the OLED display panel may include a first substrate 1 and a second substrate 2 opposite to the first substrate 1. For example, the first substrate 1 may be an array substrate, and the second substrate 2 may be a cover plate formed of, for example, glass.

For example, the OLED display panel may further include a frame sealant 3 disposed between the first substrate 1 and the second substrate 2. The frame sealant 3 is arranged in a ring shape in a peripheral area of the first substrate 1, that is, a ring of frame sealant 3 is arranged in the peripheral area of the first substrate 1. In this way, the frame sealant 3 may prevent an intrusion of water vapor and oxygen, maintain a cell thickness of the peripheral area of the display panel, and bond the first substrate and the second substrate. For example, a gap between the first substrate and the second substrate may also be filled with a filler, and the filler may be made of resin materials. By providing the filler and the frame sealant 3, a packaging structure of Dam&Filler is achieved. It should be noted that the embodiments of the present disclosure are not limited to this packaging structure, and other types of packaging structures may be used in the embodiments of the present disclosure without conflict.

Referring to FIG. 1, the first substrate 1 includes a base substrate 10. For example, the base substrate 10 may be formed of glass, plastic, polyimide, or other materials. The base substrate 10 includes a display area AA and a peripheral area (or referred to as a non-display area) NA located on at least one side of the display area AA (for convenience of description, this side is referred to as a first side). The peripheral area NA may include a first peripheral area NA1 located on a side of the frame sealant 3 close to the display area AA and a second peripheral area NA2 located on a side of the frame sealant 3 away from the display area AA.

Continuing to refer to FIG. 1, the first substrate 1 may include a plurality of pixel units P (schematically shown by a dashed box in FIG. 1) arranged in the display area AA. The plurality of pixel units P may be arranged in an array in a first direction X and a second direction Y on the base substrate 10. Each of the pixel units P may further include a plurality of sub-pixels, such as red sub-pixels, green sub-pixels and blue sub-pixels. In FIG. 1, a sub-pixel SP is schematically shown.

For example, the display panel includes a signal input side IN (the lower side shown in FIG. 1). A plurality of pads 7 are provided on the signal input side IN. The plurality of pads 7 may be electrically connected to the pixel units P located in the display area through a plurality of signal traces, and drive circuits may be electrically connected to the plurality of pads 7. In this way, signals such as data signals may be transmitted from the signal input side IN to the plurality of pixel units P.

For example, the above-mentioned first side may be the signal input side IN. That is, the peripheral area NA is located on at least the signal input side IN of the display area AA. Optionally, as shown in FIG. 1, the peripheral area NA may be located on four sides of the display area AA, that is, it surrounds the display area AA.

It should be noted that in the drawings, the pixel units and sub-pixels are schematically shown in rectangular shapes, but this does not constitute a limitation on the shapes of the pixel units and sub-pixels included in the display panel provided by the embodiments of the present disclosure.

The first substrate 1 may further include a light-emitting device, such as an OLED device 4. As shown in FIG. 2, the OLED device 4 includes a first electrode 41, a second electrode 43 opposite to the first electrode 41, and a light-emitting layer 42 between the first electrode 41 and the second electrode 43.

One of the first electrode 41 and the second electrode 43 is an anode, and the other one is a cathode. For example, the first electrode 41 may be a transparent cathode, for example, it may be formed of a transparent conductive material, which may include indium tin oxide (ITO), indium zinc oxide (IZO), and the like. The second electrode 43 may be a reflective anode, for example, it may be formed of a metal material, which may include alloys such as magnesium aluminum alloy (MgAl), lithium aluminum alloy (LiAl, or single metals such as magnesium, aluminum and lithium. The light-emitting layer 42 may have a multilayer structure, for example, it may include a multilayer structure including a hole injection layer, a hole transport layer, an organic light-emitting layer, an electron transport layer and an electron injection layer.

It should be noted that the OLED device 4 may adopt active drive or passive drive. The passive drive OLED array substrate includes a cathode and an anode, an intersection of the anode and the cathode may emit light, and the drive circuit may be externally mounted by a connection method such as a tape carrier package or chip-on-glass. The active drive OLED array substrate may be equipped with a pixel drive circuit for each pixel. The pixel drive circuit may include a thin film transistor with a switching function (that is, a switching transistor), a thin film transistor with a driving function (that is, a driving transistor), and a charge storage capacitor. In addition, the pixel drive circuit may further include other types of thin film transistors with compensation functions. It should be understood that, in the embodiments of the present disclosure, the display panel may be equipped with various types of known pixel drive circuits, which will not be repeated here.

For example, as shown in FIG. 2, the first substrate 1 includes a drive circuit layer 9. The above-mentioned pixel drive circuit may be arranged in the drive circuit layer 9. An insulating layer 91 may be provided between the drive circuit layer 9 and the OLED device 4. The insulating layer 91 may be a single insulating film layer or a stacked layer including a plurality of insulating film layers.

The first substrate 1 may further include various signal lines provided on the base substrate 10. The various signal lines include scanning lines, data lines, ELVDD power lines, ELVSS power lines and so on, so as to provide various signals such as control signals, data signals and power supply voltages to the pixel drive circuit in each sub-pixel. In the embodiments shown in FIG. 1, a scanning line GL and a data line DL are schematically shown. The scanning line GL and the data line DL may be electrically connected to each sub-pixel.

Figure 3:
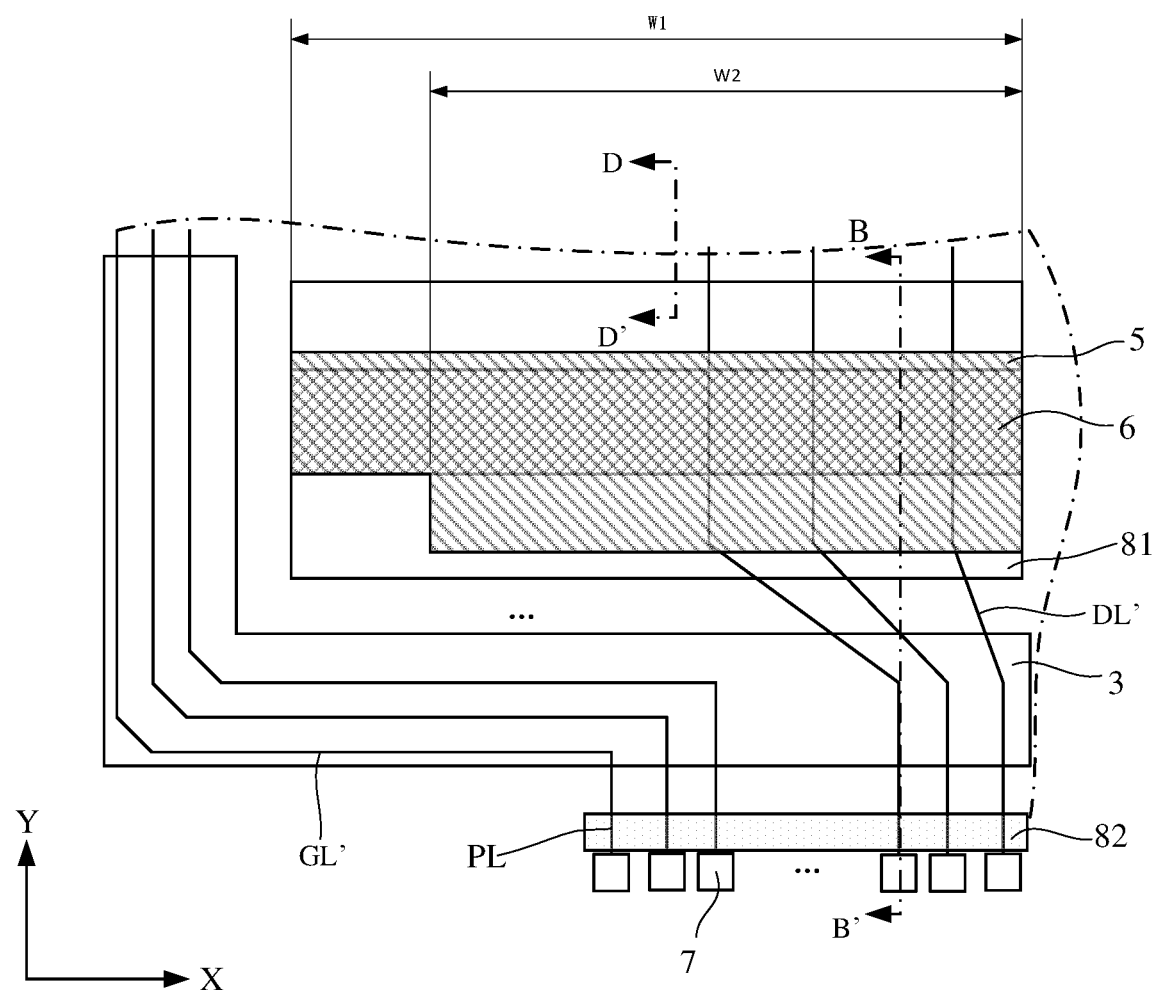
FIG. 3 shows a partial plan view of the display panel according to some exemplary embodiments of the present disclosure on a signal input side.
Figure 4:
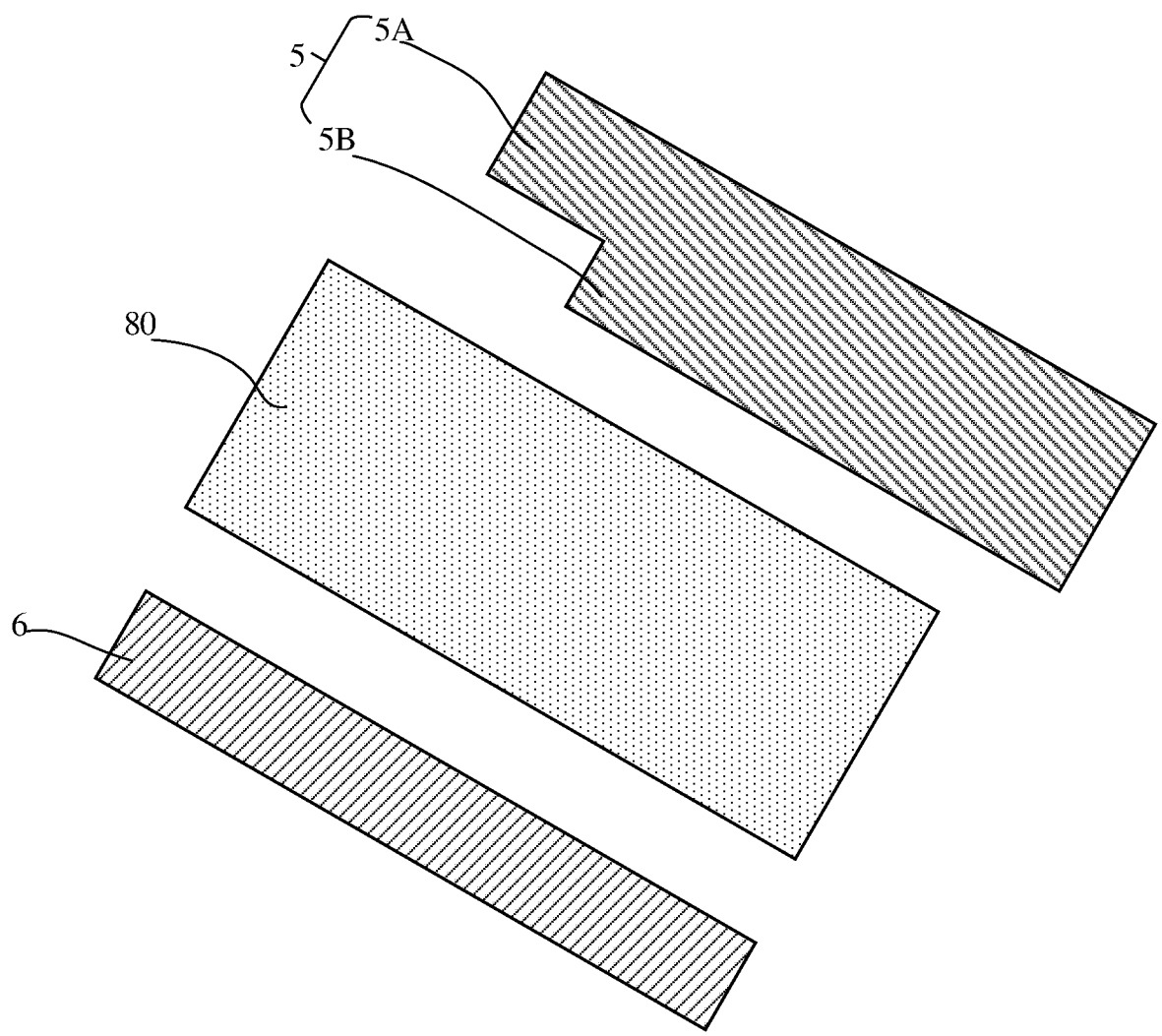
FIG. 4 shows a schematic exploded view of three film layers included in the display panel according to some exemplary embodiments of the present disclosure.
Figure 5:
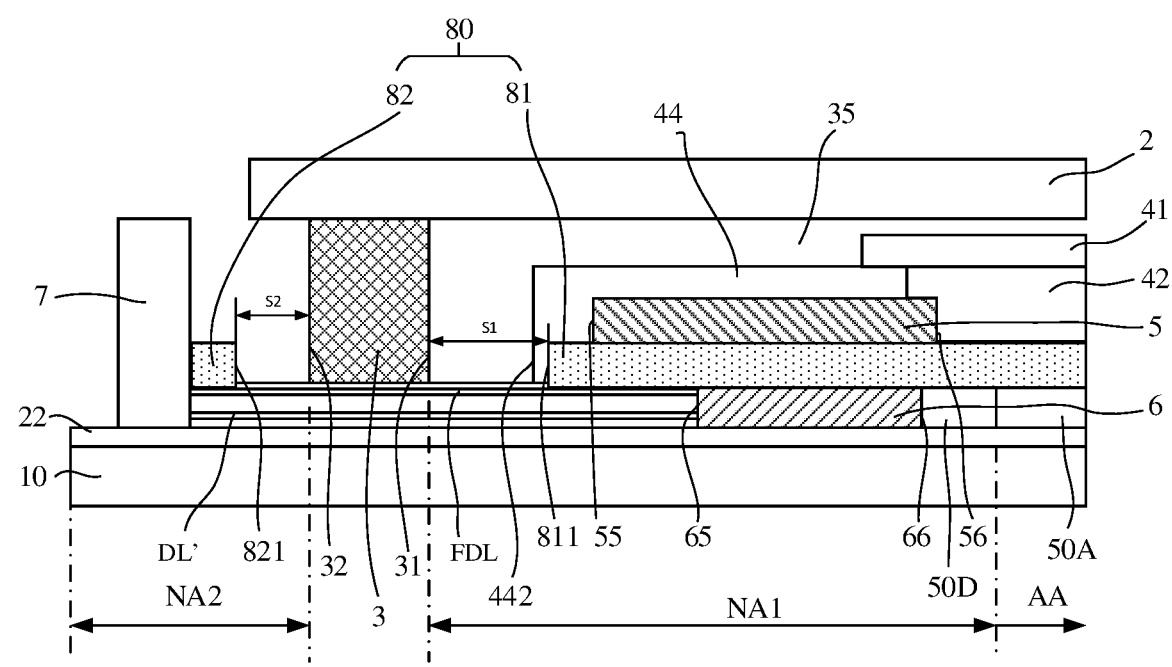
FIG. 5 shows a cross-sectional view of a first substrate included in the display panel according to some exemplary embodiments of the present disclosure, taken along line BB' in FIG. 3.
Figure 6:
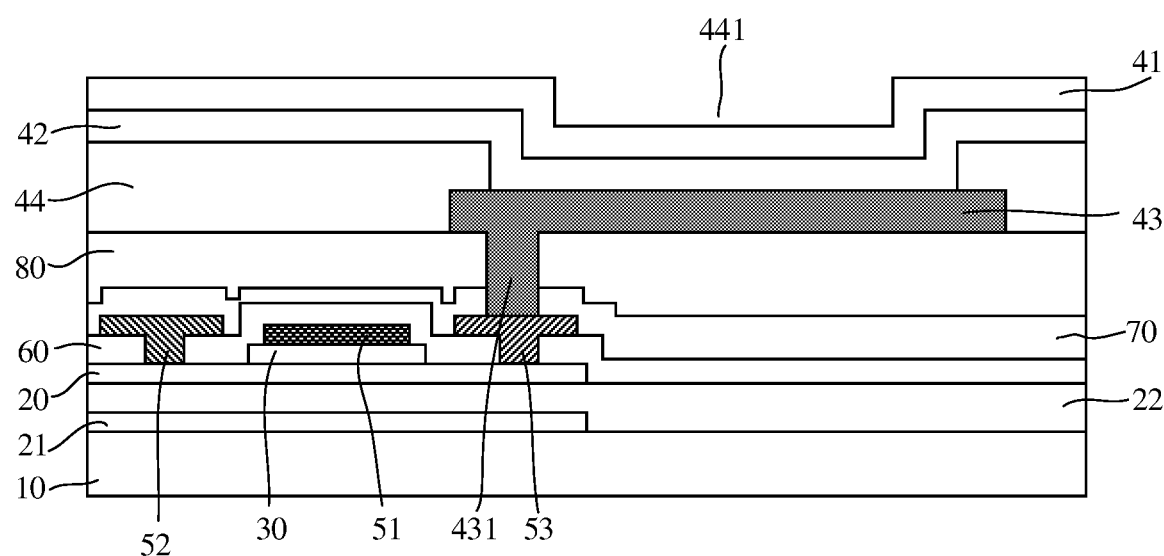
FIG. 6 shows a cross-sectional view of the first substrate included in the display panel according to some exemplary embodiments of the present disclosure, taken along line CC' in FIG. 1.
Figure 7:
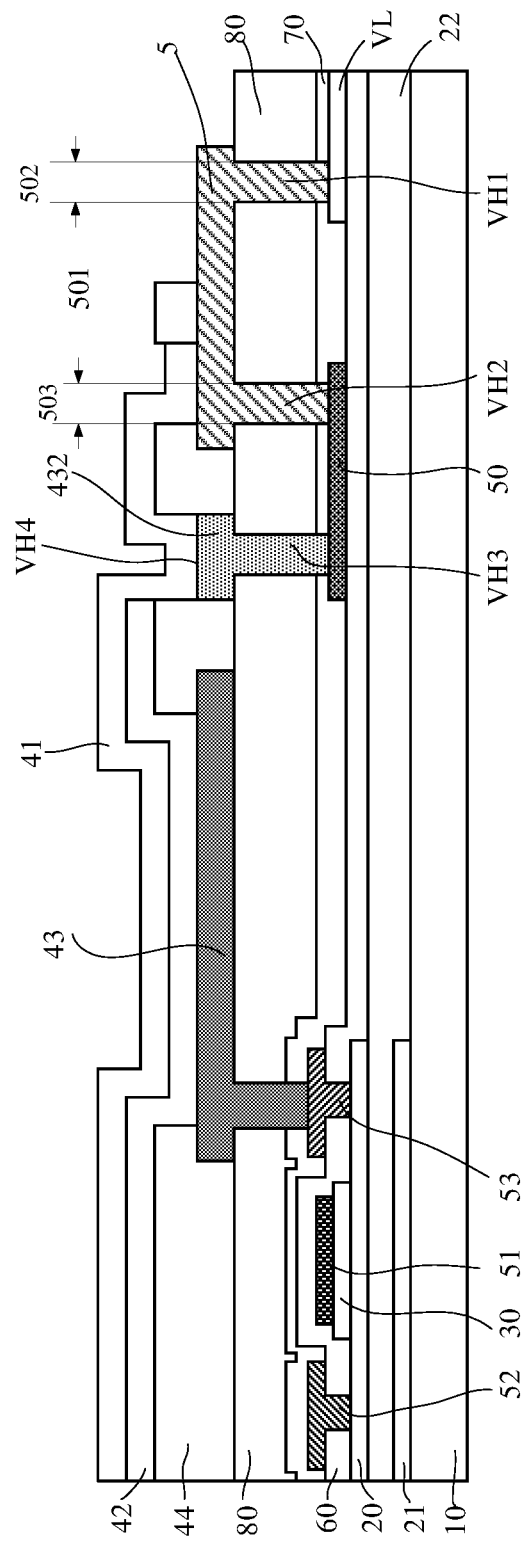
FIG. 7 shows a cross-sectional view of the first substrate included in the display panel according to some exemplary embodiments of the present disclosure, taken along line DD' in FIG. 3.

FIG. 3 shows a partial plan view of the display panel according to some exemplary embodiments of the present disclosure on the signal input side. FIG. 4 shows a schematic exploded view of three film layers included in the display panel according to some exemplary embodiments of the present disclosure. FIG. 5 shows a cross-sectional view of a first substrate included in the display panel according to some exemplary embodiments of the present disclosure, taken along line BB' in FIG. 3. FIG. 6 shows a cross-sectional view of the first substrate included in the display panel according to some exemplary embodiments of the present disclosure, taken along line CC' in FIG. 1. FIG. 7 shows a cross-sectional view of the first substrate included in the display panel according to some exemplary embodiments of the present disclosure, taken along line DD' in FIG. 3.

Referring to FIG. 3 and FIG. 4, the first substrate 1 may include a first power trace 5, a second power trace 6, a scanning trace GL', a data trace DL' and a plurality of pads 7 arranged on the base substrate 10. For example, the first power trace 5, the second power trace 6, the scanning trace GL', the data trace DL' and the plurality of pads 7 are located in the peripheral area NA, for example, on the signal input side of the peripheral area NA, which is usually a bottom border of the display panel.

It should be noted that, in the present disclosure, for the convenience of description, an area where the plurality of pads 7 are located is referred to as a pad area 105, which is usually located on the signal input side of the peripheral area NA, as shown in FIG. 1.

For example, the first power trace 5 may be a trace for providing a VSS voltage signal, and the second power trace 6 may be a trace for providing a VDD voltage signal. For example, the first power trace 5 is electrically connected to the first electrode 41, and the second power trace 6 is electrically connected to the second electrode 43. It should be noted that "the second power trace 6 is electrically connected to the second electrode 43" here may mean that the second power trace 6 is electrically connected to the second electrode 43 through an electronic component such as the thin film transistor in the pixel drive circuit.

Referring to FIGS. 1, 3 and 4 in combination, the scanning trace GL' may have one end connected to the scanning line GL located in the display area AA and the other end connected to some pads 7. The data trace DL' may have one end connected to the data line DL located in the display area AA and the other end connected to the other pads 7. The plurality of pads 7 may be connected to a driver such as a data driver. In this way, signals such as scanning signals and data signals may be input to the respective sub-pixels located in the display area AA.

The scanning trace GL' and data trace DL' are arranged in the peripheral area NA in a fan-shaped wiring manner. Accordingly, an area where the scanning traces GL' and the data traces DL' are located may be referred to as a fan-out area 104, as shown in FIG. 1.

It should be noted that in describing the signal traces located in the peripheral area and the signal lines located in the display area, scanning signals and data signals are taken as examples. The embodiments of the present disclosure are not limited to this, and signal traces and signal lines used to transmit other signals may also be set similarly.

FIG. 6 schematically shows a cross-sectional view of the first substrate 1 in the display area AA. As shown in FIG. 6, the first substrate 1 may include an active layer 20 arranged on the base substrate 10, a gate insulating layer 30 arranged on a side of the active layer 20 away from the base substrate 10, a gate electrode 51 arranged on a side of the gate insulating layer 30 away from the base substrate 10, an interlayer insulating layer 60 arranged on a side of the gate electrode 51 away from the base substrate 10, a source electrode 52 and a drain electrode 53 arranged on a side of the interlayer insulating layer 60 away from the base substrate 10, and a passivation layer 70 covering the source electrode 52 and the drain electrode 53. The source electrode 52 and the drain electrode 53 are connected to the active layer 20 through openings, respectively.

The first substrate 1 may further include a planarization layer 80 arranged on a side of the passivation layer 70 away from the base substrate 10. The second electrode 43 is electrically connected to the drain electrode 53 through an opening 431 formed in both the passivation layer 70 and the planarization layer 80.

In the embodiments of the present disclosure, a thickness of the planarization layer 80 is greater than that of the passivation layer 70. For example, the thickness of the passivation layer 70 may be between 3000 and 4000 Å (angstroms), and the thickness of the planarization layer 80 may be between 5000 and 8000 Å (angstroms).

For another example, the passivation layer 70 and the planarization layer 80 may contain an inorganic insulating material, an organic insulating material, or any combination thereof. For example, the organic insulating material may include polyimide, polyamide, acrylic resin, phenol resin, benzocyclobutene, and the like.

The first substrate 1 may further include a pixel defining layer 44 arranged on a side of the second electrode 43 away from the base substrate 10. The pixel defining layer 44 may include an opening 441 in each sub-pixel. The opening 441 exposes a portion of the second electrode 43. A portion of the light-emitting layer 42 fills the opening 441 to make contact with the exposed portion of the second electrode 43. The first electrode 41 is located on a side of the light-emitting layer 42 away from the base substrate 10.

In the exemplary illustrated embodiments, for the convenience of description, a layer where the gate electrode 51 is located may be referred to as a first conductive layer, a layer where the source electrode 52 and the drain electrode 53 are located may be referred to as a second conductive layer, a layer where the second electrode 43 is located may be referred to as a third conductive layer, and a layer where the first electrode 41 is located may be referred to as a fourth conductive layer.

For example, the first conductive layer may be a conductive layer made of a gate material, the second conductive layer may be a conductive layer made of a source/drain material, the third conductive layer may be a conductive layer made of an anode material, and the fourth conductive layer may be a conductive layer made of a cathode material.

For example, the gate material may include a metal material, such as Mo, Al, Cu and alloys thereof. The source/drain material may include a metal material, such as Mo, Al, Cu and alloys thereof. The anode material may include a conductive metal material, such as magnesium, aluminum, lithium and alloys thereof. The cathode material may include a transparent conductive material, such as indium tin oxide (ITO), indium zinc oxide (IZO), and the like.

Optionally, the first substrate 1 may further include a light shielding layer 21. The light shielding layer 21 is arranged on a side of the active layer 20 close to the base substrate 10. An orthographic projection of the light shielding layer 21 on the base substrate 10 covers an orthographic projection of the active layer 20 on the base substrate 10, so as to avoid an influence of external light on the active layer 20. The first substrate 1 may further include a buffer layer 22 arranged between the light shielding layer 21 and the active layer 20.

Optionally, the light shielding layer 21 may be electrically connected to a conductive structure located in the third conductive layer, for example, it may be electrically connected to the first power trace 5. In this way, the light shielding layer 21 may be prevented from being floating, which is beneficial to keeping stable electrical performance of the thin film transistor.

FIG. 5 schematically shows a cross-sectional view of the first substrate 1 in the peripheral area NA. Referring to FIG. 5 and FIG. 6 in combination, the first power trace 5 and the second power trace 6 are located in different layers. For example, the first power trace 5 may be located in the third conductive layer, that is, the first power trace 5 is located in the same layer as the second electrode 43. The second power trace 6 may be located in the first conductive layer, that is, the second power trace 6 is located in the same layer as the gate electrode 51. Alternatively, the second power trace 6 may be located in the second conductive layer, that is, the second power trace 6 is located in the same layer as the source electrode 52 and the drain electrode 53.

Referring to FIGS. 3 to 5 in combination, an orthographic projection of the first power trace 5 on the base substrate 10 at least partially overlaps an orthographic projection of the second power trace 6 on the base substrate 10. Specifically, on the side of the peripheral area NA where the plurality of pads 7 are located, the orthographic projection of the first power trace 5 on the base substrate 10 at least partially overlaps the orthographic projection of the second power trace 6 on the base substrate 10. In particular, the orthographic projection of the first power trace 5 on the base substrate 10 covers the orthographic projection of the second power trace 6 on the base substrate 10. Referring to FIG. 5, the first power trace 5 includes a first side surface 55 away from the display area AA and a second side surface 56 close to the display area AA, and the second power trace 6 includes a first side surface 65 away from the display area AA and a second side surface 66 close to the display area AA. An orthographic projection of the first side surface 55 of the first power trace 5 on the base substrate 10 is farther away from the display area AA than an orthographic projection of the first side surface 65 of the second power trace 6 on the base substrate 10, and an orthographic projection of the second side surface 56 of the first power trace 5 on the base substrate 10 is closer to the display area AA than an orthographic projection of the second side surface 66 of the second power trace 6 on the base substrate 10. Thus, on the signal input side of the peripheral area NA where the pads 7 are located, the first power trace 5 covers the second power trace 6.

Further, referring to FIG. 5, the planarization layer 80 extends from the display area AA to the peripheral area NA. The planarization layer 80 is arranged not only in the first peripheral area NA1 but also in the second peripheral area NA2. For the convenience of description, a portion of the planarization layer 80 arranged in the first peripheral area NA1 is referred to as a first portion 81, and a portion of the planarization layer 80 arranged in the second peripheral area NA2 is referred to as a second portion 82.

The first portion 81 of the planarization layer 80 is arranged between the first power trace 5 and the second power trace 6. Specifically, the first portion 81 of the planarization layer 80 includes a first side surface 811 away from the display area AA. An orthographic projection of the first side surface 811 on the base substrate 10 is farther away from the display area AA than the orthographic projection of the first side surface 55 of the first power trace 5 on the base substrate 10. Thus, the orthographic projection of the planarization layer 80 on the base substrate 10 not only at least partially overlaps the orthographic projection of the first power trace 5 on the base substrate 10, but also at least partially overlaps the orthographic projection of the second power trace 6 on the base substrate 10.

Since the planarization layer 80 is formed of an insulating material, the planarization layer 80 may function to insulate the first power trace 5 from the second power trace 6, thereby avoiding undesirable phenomena such as short circuit between the first power trace 5 and the second power trace 6. Moreover, since the planarization layer 80 is relatively thick, the insulation may be better achieved by providing the planarization layer between the first power trace 5 and the second power trace 6.

Further, the first portion 81 of the planarization layer 80 is arranged between the first power trace 5 and the plurality of signal lines located in the fan-out area 104 so as to insulate the first power trace 5 from the plurality of signal lines. For example, the plurality of signal lines include the data trace DL'. In an optional embodiment, the data trace DL' may be located in the second conductive layer, that is, it is located in the same layer as the source electrode 52 and the drain electrode 53. Certainly, the embodiments of the present disclosure are not limited to this, and the plurality of signal lines may also include other types of signal lines located in the first conductive layer.

In other words, the planarization layer 80 may also insulate the first power trace 5 from the signal lines located in the first conductive layer or the second conductive layer. Specifically, each signal line DL' located in the first conductive layer or the second conductive layer includes a first portion FDL located in the fan-out area 104. The orthographic projection of the first portion 81 of the planarization layer 80 on the base substrate 10 at least partially overlaps an orthographic projection of the first portion FDL on the base substrate 10. Thus, the planarization layer 80 also functions to insulate the first power trace from the signal line located below the planarization layer 80.

Referring to FIG. 4, the orthographic projection of the first power trace 5 on the base substrate 10 has a T shape. For example, the first power trace 5 includes a first portion 5A and a second portion 5B. An orthographic projection of the first portion 5A on the base substrate 10 at least partially overlaps the orthographic projection of the second power trace 6 on the base substrate 10, and an orthographic projection of the second portion 5B on the base substrate 10 does not overlap the orthographic projection of the second power trace 6 on the base substrate 10. The first portion 5A has a first size (or width) W1 in the first direction X, and the second portion 5B has a second size (or width) W2 in the first direction X. The first size W1 is greater than the second size W2.

The first power trace 5 does not overlap the scanning trace GL'. For example, the scanning trace GL' may be located in the first conductive layer, that is, it is located in the same layer as the gate electrode 51. The scanning trace GL' may include a first portion located in the fan-out area 104. The orthographic projection of the first power trace 5 on the base substrate 10 does not overlap an orthographic projection of the first portion of the scanning trace GL' on the base substrate 10. Thus, it is possible to prevent the signal transmitted over the first power trace 5 from affecting the scanning signal transmitted over the scanning trace GL'.

Continuing to refer to FIG. 5, the insulating layers such as the buffer layer 22 also extend from the display area AA to the peripheral area NA. For example, in the peripheral area NA, the first substrate 1 includes the buffer layer 22 arranged on the base substrate 10. The second power trace 6 is arranged on the side of the buffer layer 22 away from the base substrate 10. The planarization layer 80 is arranged on a surface of the second power trace 6 away from the base substrate 10. The first power trace 5 is arranged on a surface of the planarization layer 80 away from the base substrate 10. In addition, the first power trace 5 is in contact with the surface of the planarization layer 80 away from the base substrate 10, and the second power trace 6 is in contact with the surface of the planarization layer 80 close to the base substrate 10.

Referring to FIG. 6, since the thickness of the passivation layer 70 is smaller than that of the planarization layer 80, a surface of the passivation layer 70 away from the base substrate 10 (that is, the upper surface in FIG. 6) may be an uneven surface, that is, a flatness of the surface is not good enough. In the embodiments of the present disclosure, the planarization layer 80 is thicker and has a better flatness. Thus, the first power trace 5 is directly formed on the planarization layer 80, which facilitates the manufacturing process of the first power trace 5.

Further, each of the signal lines GL', DL' located in the first conductive layer or the second conductive layer further includes a second portion PL located in the second peripheral area NA2. The second portion 82 of the planarization layer 80 covers the second portion PL of the signal line, that is, an orthographic projection of the second portion 82 of the planarization layer 80 on the base substrate 10 at least partially overlaps an orthographic projection of the second portion PL of the signal line on the base substrate 10. Thus, the planarization layer 80 may also function to protect the signal lines located in the pad area 105. For example, when the pad area 105 is pressed, even if the pressing force is large, the second portion 82 of the planarization layer 80 may still protect the signal lines below the second portion 82 of the planarization layer 80 and prevent the insulating layers between the signal lines from being damaged due to excessive pressing force, thereby further reducing the risk of short circuits.

Referring to FIG. 5, the first portion 81 and the second portion 82 of the planarization layer 80 are respectively located on both sides of the frame sealant 3 and are spaced apart from the frame sealant 3.

For example, a spacing distance between the first portion 81 and the frame sealant 3 is S1, and a spacing distance between the second portion 82 and the frame sealant 3 is S2. Specifically, the frame sealant 3 includes a first side surface 31 close to the display area AA and a second side surface 32 away from the display area AA. The second portion 82 includes a first side surface 821 close to the display area AA. The spacing distance S1 is a vertical distance between the first side surface 811 of the first portion 81 and the first side surface 31 of the frame sealant 3. The spacing distance S2 is a vertical distance between the first side surface 821 of the second portion 82 and the second side surface 32 of the frame sealant 3.

In an exemplary embodiment, the spacing distances S1 and S2 are both above 50 microns, for example, between 100 and 900 microns. With such a spacing arrangement, it is possible to avoid forming a water and oxygen intrusion path from the second portion of the planarization layer through the frame sealant to the first portion of the planarization layer, thereby avoiding the intrusion of water and oxygen.

Continuing to refer to FIG. 5, the pixel defining layer 44 also extends from the display area AA to the peripheral area NA. On the signal input side of the peripheral area NA shown in FIG. 5, the pixel defining layer 44 at least partially overlaps the first power trace 5, and the pixel defining layer 44 also at least partially overlaps the planarization layer 80.

Specifically, an orthographic projection of the pixel defining layer 44 on the base substrate 10 at least partially overlaps the orthographic projection of the first portion 81 of the planarization layer 80 on the base substrate 10. For example, the orthographic projection of the pixel defining layer 44 on the base substrate 10 covers the orthographic projection of the first portion 81 of the planarization layer 80 on the base substrate 10. The pixel defining layer 44 includes a first side surface 442 away from the display area AA. An orthographic projection of the first side surface 442 on the base substrate 10 is farther away from the display area AA than the orthographic projection of the first side surface 811 of the first portion 81 on the base substrate 10.

Optionally, an orthographic projection of the light-emitting layer 42 on the base substrate 10 at least partially overlaps the orthographic projection of the first power trace 5 on the base substrate 10. The orthographic projection of the first electrode 41 on the base substrate 10 at least partially overlaps the orthographic projection of the first power trace 5 on the base substrate 10.

It should be noted that, in the embodiments shown in FIG. 5, a dummy pixel structure and a pixel structure located in the display area AA may be sequentially arranged on a side of the second power trace 6 facing the display area AA. In FIG. 5, they are respectively shown in the form of rectangular boxes 50D and 50A in order to simplify the drawing. It should be understood that the dummy pixel structure and the pixel structure located in the display area AA represented by the rectangular boxes 50D and 50A may adopt known dummy pixel structures and pixel structures located in the display area AA, which will not be repeated here.

It should be understood that a gap between the first substrate 1 and the second substrate 2 may also be filled with a filler, as shown by the reference numeral 35 in FIG. 5.

FIG. 7 schematically illustrates an implementation of an electrical connection between the first power trace and the first electrode of the OLED device in the display panel according to some exemplary embodiments of the present disclosure.

Referring to FIGS. 5, 6 and 7 in combination, the display panel may further include a first power lead VL located in the fan-out area 104. The first power lead VL may be arranged in the first conductive layer or the second conductive layer. For example, the first power lead VL is arranged in the second conductive layer, that is, it is located in the same layer as the source electrode 52 and the drain electrode 53 of the thin film transistor. The first power lead VL has one end connected to the pad 7 and the other end connected to the first power trace 5.

For example, an insulating layer is provided between the layer where the first power lead VL is located (that is, the second conductive layer) and the layer where the first power trace 5 is located (that is, the third conductive layer). The insulating layer may be at least one of the passivation layer 70 and the planarization layer 80. The first power lead VL is connected to the first power trace 5 through a first opening VH1 penetrating the insulating layers.

The display panel may further include an auxiliary electrode trace 50. For example, the auxiliary electrode trace 50 may be arranged in the second conductive layer, that is, it is located in the same layer as the source electrode 52 and the drain electrode 53 of the thin film transistor. The first power trace 5 is connected to the auxiliary electrode trace 50 through a second opening VH2 penetrating the insulating layers.

The display panel may further include a conductive connection portion 432. For example, the conductive connection portion 432 may be arranged in the third conductive layer, that is, it is located in the same layer as the second electrode 43. The auxiliary electrode trace 50 is connected to the conductive connection portion 432 through a third opening VH3 penetrating the insulating layers.

The display panel further includes a fourth opening VH4 penetrating the pixel defining layer 44. The conductive connection portion 432 is connected to the first electrode 41 through the fourth opening VH4.

With such a connection, the electrical connection between the first power trace 5 and the first electrode 41 of the OLED device is achieved. In addition, by providing the auxiliary electrode trace structure, it is possible to reduce a voltage drop generated in the process of transmitting a power supply voltage such as the VSS voltage to the display area AA, thereby improving the display uniformity.

Referring to FIGS. 3, 5 and 7 in combination, the first power trace 5 may include a first trace portion 501, a second trace portion 502 and a third trace portion 503. An orthographic projection of the second trace portion 502 of the first power trace 5 on the base substrate 10 covers an orthographic projection of the first opening VH1 on the base substrate 10, and an orthographic projection of the third trace portion 503 of the first power trace 5 on the base substrate 10 covers an orthographic projection of the second opening VH2 on the base substrate 10. The first trace portion 501 of the first power trace 5 is a portion of the first power trace 5 other than the second trace portion 502 and the third trace portion 503. The orthographic projection of the planarization layer 80 on the base substrate 10 covers an orthographic projection of the first trace portion 501 of the first power trace 5 on the base substrate 10. In other words, an orthographic projection of a combination of the planarization layer 80, the first opening VH1 and the second opening VH2 on the base substrate 10 covers the orthographic projection of the first power trace 5 on the base substrate 10.

The embodiments of the present disclosure further provide a manufacturing method of a display substrate. For example, the manufacturing method may include steps of: providing a base substrate including a display area and a peripheral area located on at least a first side of the display area; forming a plurality of pixel units in the display area of the base substrate, wherein the plurality of pixel units are arranged in an array in a first direction and a second direction in the display area of the base substrate, and each of the plurality of pixel units includes a pixel drive circuit; forming a planarization layer on a side of the pixel units away from the base substrate, wherein at least a portion of the planarization layer is located in the peripheral area; forming a plurality of light-emitting devices on the base substrate, wherein the plurality of light-emitting devices are respectively electrically connected to the pixel drive circuits of the plurality of pixel units, each of the light-emitting devices includes a first electrode, a second electrode, and a light-emitting layer arranged between the first electrode and the second electrode; forming a first power trace and a second power trace in the peripheral area of the base substrate; and forming a frame sealant in the peripheral area of the base substrate, wherein the peripheral area includes a first peripheral area on a side of the frame sealant close to the display area and a second peripheral area on a side of the frame sealant away from the display area, the first side of the display area is a signal input side, and the first power trace and the second power trace are both located in the first peripheral area and on the signal input side. The first power trace is electrically connected to the first electrode, and the second power trace is electrically connected to the second electrode. An orthographic projection of the planarization layer on the base substrate at least partially overlaps an orthographic projection of each of the first power trace and the second power trace on the base substrate, the first power trace and the second power trace are located in different layers, and a portion of the planarization layer is located between the first power trace and the second power trace. In this way, undesirable phenomena such as a short circuit between the first power trace and the second power trace may be avoided.

Figure 8:
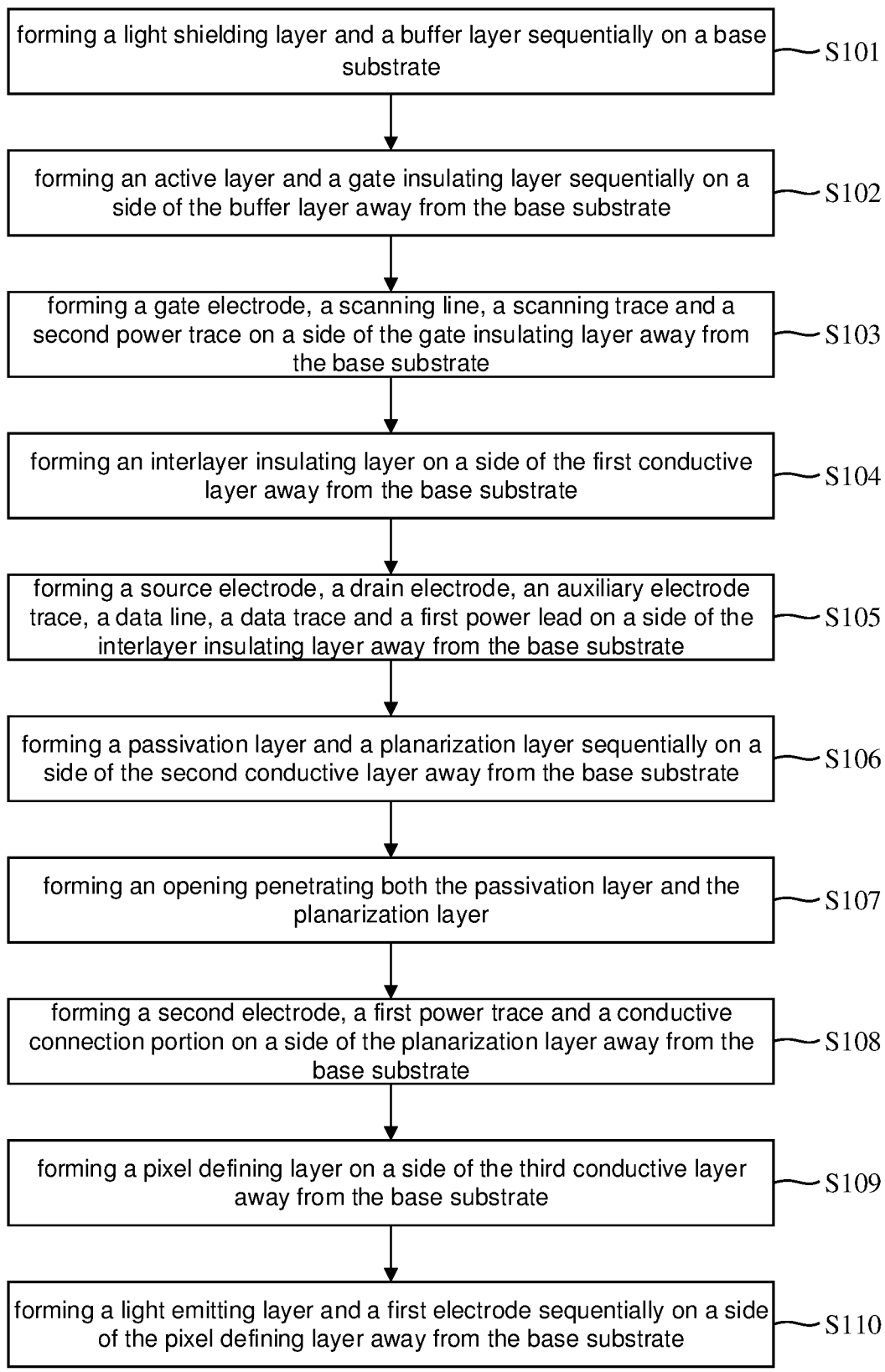
FIG. 8 shows a flowchart of a manufacturing method of a display panel according to some exemplary embodiments of the present disclosure.

FIG. 8 shows a flowchart of a manufacturing method of a display substrate according to some exemplary embodiments of the present disclosure. Referring to FIGS. 5 to 8 in combination, the manufacturing method of the display substrate may be performed according to the following steps.

In step S101, a light shielding layer 21 and a buffer layer 22 are sequentially formed on the base substrate 10.

Specifically, a layer of light shielding film may be deposited on the base substrate 10, and then the light shielding layer 21 as shown in FIG. 6 is formed through a patterning process. Next, a buffer layer film is deposited on the light shielding layer 21 to form a buffer layer 22 covering the light shielding layer 21, as shown in FIG. 6. For example, the light shielding layer 21 may include a single-layer or stacked-layer structure formed of materials such as Mo, Al/Mo, Mo/Ti, and the buffer layer 22 may include a single-layer or stacked-layer structure formed of materials such as silicon nitride or silicon oxide.

In step S102, an active layer 20 and a gate insulating layer 30 are sequentially formed on the side of the buffer layer 22 away from the base substrate 10.

Specifically, a semiconductor material layer may be first formed on the side of the buffer layer 22 away from the base substrate 10, and then the active layer 20 as shown in FIG. 6 is formed through a patterning process. Next, a layer of insulating film is deposited on the side of the active layer 20 away from the base substrate 10 to form the gate insulating layer 30 as shown in FIG. 6.

In step S103, a gate electrode 51, a scanning line GL, a scanning trace GL' and a second power trace 6 are formed on the side of the gate insulating layer 30 away from the base substrate 10.

Specifically, a first metal film may be deposited on the side of the gate insulating layer 30 away from the base substrate 10. Then, the gate electrode 51, the scanning line GL, the scanning trace GL' and the second power trace 6 are formed through a patterning process, that is, the first conductive layer is formed.

In step S104, an interlayer insulating layer 60 is formed on the side of the first conductive layer away from the base substrate 10.

Optionally, after the interlayer insulating layer 60 is formed, an opening may be formed in the interlayer insulating layer 60 through a patterning process, so that the source and drain electrodes formed later are connected to the active layer 20.

In step S105, a source electrode 52, a drain electrode 53, an auxiliary electrode trace 50, a data line DL, a data trace DL' and a first power lead VL are formed on the side of the interlayer insulating layer 60 away from the base substrate 10.

Specifically, a second metal thin film is deposited on the side of the interlayer insulating layer 60 away from the base substrate 10. Then, the source electrode 52, the drain electrode 53, the auxiliary electrode trace 50, the data line DL, the data trace DL' and the first power lead VL described above are formed through a patterning process, that is, the above-mentioned second conductive layer is formed.

In step S106, a passivation layer 70 and a planarization layer 80 are sequentially formed on the side of the second conductive layer away from the base substrate 10.

Specifically, on the basis of forming the above structures, a third insulating film is applied, and the passivation layer 70 covering the source electrode 52, the drain electrode 53, the auxiliary electrode trace 50, the data line DL, the data trace DL' and the first power lead VL described above is formed through a patterning process. Then, a fourth insulating film is applied, and the planarization layer 80 covering the passivation layer 70 is formed through a patterning process, as shown in FIG. 6.

In step S107, an opening 431 penetrating both the passivation layer 70 and the planarization layer 80 is formed.

For example, since the thickness of each of the passivation layer 70 and the planarization layer 80 is large, the opening 431 may be formed in two steps. First, a first portion of the opening 431 exposing a portion of the drain electrode 53 is formed. Then, a second portion of the opening 431 is formed.

In step S108, a second electrode 43, a first power trace 5 and a conductive connection portion 432 are formed on the side of the planarization layer 80 away from the base substrate 10.

Specifically, on the basis of forming the above structures, a third metal thin film is deposited on the side of the planarization layer 80 away from the base substrate 10. Then, the second electrode 43, the first power trace 5 and the conductive connection portion 432 described above are formed through a patterning process, that is, the above-mentioned third conductive layer is formed.

In step S109, a pixel defining layer 44 is formed on the side of the third conductive layer away from the base substrate 10.

Specifically, a pixel defining film is applied on the side of the third conductive layer away from the base substrate 10, and then the pixel defining layer 44 having an opening 441 is formed through a patterning process.

In step S110, a light-emitting layer 42 and a first electrode 41 are sequentially formed on the side of the pixel defining layer 44 away from the base substrate.

For example, the light-emitting layer 42 and the first electrode 41 may be formed by an evaporation process.

It should be noted that each step of the above-mentioned manufacturing method is only an illustrative description. In practical implementation, the corresponding structure may be changed and the patterning process may be increased or decreased according to actual needs. For example, the display panel may further be provided with other electrodes, leads, and structural film layers. The embodiments of the present disclosure are not specifically limited herein.

It should be noted that according to some embodiments of the present disclosure, some steps in the above-mentioned method may be executed separately or in combination, and may be executed in parallel or sequentially, which are not limited to the specific operation sequence shown in FIG. 8.

Figure 9:
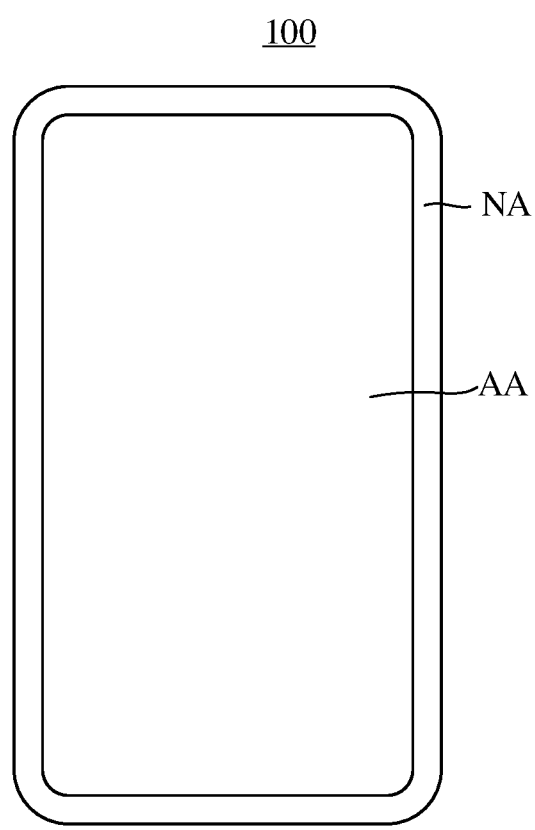
FIG. 9 shows a schematic view of a display device according to some exemplary embodiments of the present disclosure.

FIG. 9 shows a schematic view of a display device according to some exemplary embodiments of the present disclosure. The display device 100 includes the above-mentioned display panel. For example, it includes the display area AA and the peripheral area NA, and the film layer structure in the display area AA and the peripheral area NA may refer to the description of each of the above-mentioned embodiments, which will not be repeated here.

The display device may include any apparatus or product with a display function. For example, the display device may be a smart phone, a mobile phone, an e-book reader, a personal computer (PC), a laptop PC, a netbook PC, a personal digital assistant (PDA), a portable multimedia player (PMP), a digital audio player, a mobile medical apparatus, a camera, a wearable device (such as a head-mounted device, electronic clothing, electronic bracelet, electronic necklace, electronic accessory, electronic tattoo or smart watch), a television, etc.

It should be understood that the display device according to the embodiments of the present disclosure has all the features and advantages of the above-mentioned display substrate (for example, the first substrate) and the display panel. The details may refer to the above description.

Although some embodiments of the general technical concept of the present disclosure have been illustrated and described, it should be understood by those skilled in the art that these embodiments may be changed without departing from the principle and spirit of the general technical concept of the present disclosure. The scope of the present disclosure shall be defined by the claims and their equivalents.

What is claimed is:

1. A display substrate, comprising:
   a base substrate comprising a display area and a peripheral area located on at least a first side of the display area;
   a plurality of pixel units arranged in an array in a first direction and a second direction in the display area of the base substrate, wherein each of the plurality of pixel units comprises a pixel drive circuit and a light-emitting device electrically connected to the pixel drive circuit, and the light-emitting device comprises a first electrode, a second electrode, and a light-emitting layer between the first electrode and the second electrode;
   a first power trace located in the peripheral area and electrically connected to the first electrode;
   a second power trace located in the peripheral area and electrically connected to the second electrode;
   a planarization layer, wherein at least a portion of planarization layer is located in the peripheral area; and
   a frame sealant arranged on the base substrate,
   wherein the peripheral area comprises a first peripheral area on a side of the frame sealant close to the display area and a second peripheral area on a side of the frame sealant away from the display area, the first side of the display area is a signal input side, and the first power trace and the second power trace are both located in the first peripheral area and on the signal input side, and
   wherein an orthographic projection of each of the first power trace and the second power trace on the base substrate falls within an orthographic projection of the planarization layer on the base substrate, the orthographic projection of the planarization layer on the base substrate is spaced apart from an orthographic projection of the frame sealant on the base substrate, the first power trace and the second power trace are located in different layers, and a portion of the planarization layer is located between the first power trace and the second power trace.

2. The display substrate according to claim 1, wherein the planarization layer comprises a first portion in the first peripheral area and a second portion in the second peripheral area, an orthographic projection of the first portion of the planarization layer on the base substrate at least partially overlaps the orthographic projection of each of the first power trace and the second power trace on the base substrate, and the first portion of the planarization layer is located between the first power trace and the second power trace.

3. The display substrate according to claim 2, wherein the first portion of the planarization layer has a first side surface away from the display area, the first power trace has a first side surface away from the display area, the second power trace has a first side surface away from the display area, the first side surface of the first power trace is farther away from the display area than the first side surface of the second power trace, and the first side surface of the first portion of the planarization layer is farther away from the display area than the first side surface of the first power trace.

4. The display substrate according to claim 2, wherein the first portion of the planarization layer is located on a side of the second power trace away from the base substrate and is in contact with a surface of the second power trace away from the base substrate.

5. The display substrate according to claim 4, wherein the first portion of the planarization layer is located on a side of the first power trace close to the base substrate and is in contact with a surface of the first power trace close to the base substrate.

6. The display substrate according to claim 2, further comprising a plurality of pads on the signal input side and in the peripheral area, wherein the second portion of the planarization layer is adjacent to the plurality of pads.

7. The display substrate according to claim 6, further comprising a first signal trace electrically connecting at least one of the plurality of pads and at least one of the plurality of pixel units, wherein the first signal trace comprises a first portion in the first peripheral area and a second portion in the second peripheral area, and
   wherein the first portion of the first signal trace is located in a different layer from the first power trace, the first portion of the planarization layer is located between the first power trace and the first portion of the first signal trace, and the orthographic projection of the first portion of the planarization layer on the base substrate at least partially overlaps an orthographic projection of the first portion of the first signal trace on the base substrate.

8. The display substrate according to claim 6, wherein an orthographic projection of the second portion of the planarization layer on the base substrate at least partially overlaps an orthographic projection of the second portion of the first signal trace on the base substrate.

9. The display substrate according to claim 2, wherein each of the first portion of the planarization layer and the second portion of the planarization layer is spaced apart from the frame sealant.

10. The display substrate according to claim 6, further comprising a second signal trace electrically connecting at least one of the plurality of pads and at least one of the plurality of pixel units, wherein the orthographic projection of the first power trace on the base substrate does not overlap an orthographic projection of the second signal trace on the base substrate.

11. The display substrate according to claim 10, wherein the first power trace comprises a first portion and a second portion, an orthographic projection of the first portion of the first power trace on the base substrate at least partially overlaps the orthographic projection of the second power trace on the base substrate, and an orthographic projection of the second portion of the first power trace on the base substrate does not overlap the orthographic projection of the second power trace on the base substrate.

12. The display substrate according to claim 11, wherein the first portion of the first power trace has a first size in the first direction, the second portion of the first power trace has a second size in the first direction, and the first size is greater than the second size.

13. The display substrate according to claim 2, further comprising:
   at least one thin film transistor on the base substrate, wherein the thin film transistor comprises an active layer, a gate electrode, a source electrode and a drain electrode;
   a first conductive layer on a side of the active layer away from the base substrate, wherein the gate electrode is located in the first conductive layer;
   a second conductive layer on a side of the first conductive layer away from the base substrate, wherein the source electrode and the drain electrode are located in the second conductive layer;
   a third conductive layer on a side of the second conductive layer away from the base substrate, wherein the second electrode is located in the third conductive layer; and
   a fourth conductive layer on a side of the third conductive layer away from the base substrate, wherein the first electrode is located in the fourth conductive layer,
   wherein the display substrate further comprises a passivation layer between the second conductive layer and the third conductive layer, and the planarization layer is arranged between the passivation layer and the third conductive layer; and/or, the first power trace is located in the third conductive layer; and/or the second power trace is located in the second conductive layer.

14. The display substrate according to claim 13, further comprising an auxiliary electrode trace located in the second conductive layer, wherein the auxiliary electrode trace electrically connects the first power trace and the first electrode.

15. The display substrate according to claim 14, further comprising a first power lead in the first conductive layer or the second conductive layer, and a conductive connection portion in the third conductive layer;
   wherein the first power lead has one end connected to one of the plurality of pads and the other end connected to the first power trace through a first opening; and
   wherein the first power trace is connected to the auxiliary electrode trace through a second opening, the auxiliary electrode trace is connected to the conductive connection portion through a third opening, and the conductive connection portion is connected to the first electrode through a fourth opening.

16. The display substrate according to claim 15, wherein the first power trace comprises a first trace portion, a second trace portion and a third trace portion, an orthographic projection of the second trace portion of the first power trace on the base substrate covers an orthographic projection of the first opening on the base substrate, an orthographic projection of the third trace portion of the first power trace on the base substrate covers an orthographic projection of the second opening on the base substrate, the first trace portion of the first power trace is a portion of the first power trace other than the second trace portion and the third trace portion, and the orthographic projection of the planarization layer on the base substrate covers an orthographic projection of the first trace portion of the first power trace on the base substrate.

17. The display substrate according claim 2, further comprising a pixel defining layer on a side of the second electrode away from the base substrate,
   wherein an orthographic projection of the pixel defining layer on the base substrate covers the orthographic projection of the first portion of the planarization layer on the base substrate, or
   wherein the pixel defining layer comprises a first side surface away from the display area, and an orthographic projection of the first side surface of the pixel defining layer on the base substrate is farther away from the display area than an orthographic projection of the first side surface of the first portion of the planarization layer on the base substrate.

18. A display panel comprising the display substrate according to claim 1.

19. A display device comprising the display substrate according to claim 1.

20. A manufacturing method of a display substrate, comprising:
   providing a base substrate comprising a display area and a peripheral area located on at least a first side of the display area;
   forming a plurality of pixel units in the display area of the base substrate, wherein the plurality of pixel units are arranged in an array in a first direction and a second direction in the display area of the base substrate, and each of the plurality of pixel units comprises a pixel drive circuit;
   forming a planarization layer on a side of the pixel units away from the base substrate, wherein at least a portion of the planarization layer is located in the peripheral area;
   forming a plurality of light-emitting devices on the base substrate, wherein each of the plurality of light-emitting devices is electrically connected to a respective one of the pixel drive circuits of the plurality of pixel units, and each of the plurality of light-emitting devices comprises a first electrode, a second electrode, and a light-emitting layer between the first electrode and the second electrode;
   forming a first power trace and a second power trace in the peripheral area of the base substrate; and
   forming a frame sealant in the peripheral area of the base substrate,
   wherein the peripheral area comprises a first peripheral area on a side of the frame sealant close to the display area and a second peripheral area on a side of the frame sealant away from the display area, the first side of the display area is a signal input side, and the first power trace and the second power trace are both located in the first peripheral area and on the signal input side, and an orthographic projection of each of the first power trace and the second power trace on the base substrate does not overlap with an orthographic projection of the frame sealant on the base substrate;
   wherein the first power trace is electrically connected to the first electrode, and the second power trace is electrically connected to the second electrode; and wherein an orthographic projection of each of the first power trace and the second power trace on the base substrate falls within an orthographic projection of the planarization layer on the base substrate, the first power trace and the second power trace are located in different layers, and a portion of the planarization layer is located between the first power trace and the second power trace.

\* \* \* \* \*